United States Patent [19]
Feng et al.

[11] Patent Number: 5,902,650
[45] Date of Patent: *May 11, 1999

[54] METHOD OF DEPOSITING AMORPHOUS SILICON BASED FILMS HAVING CONTROLLED CONDUCTIVITY

[75] Inventors: Jeff Feng, San Jose; Robert Robertson, Menlo Park; Kam Law, Union City, all of Calif.

[73] Assignee: Applied Komatsu Technology, Inc., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/500,728

[22] Filed: Jul. 11, 1995

[51] Int. Cl.$^6$ .......................................................... B05D 3/06
[52] U.S. Cl. ........................ 427/578; 427/255; 427/255.1; 427/255.2; 148/DIG. 1
[58] Field of Search ................................... 427/578, 248.1, 427/255, 255.1, 255.2; 148/DIG. 1

[56] References Cited

U.S. PATENT DOCUMENTS
5,576,060  11/1996  Hirai et al. ............................ 427/255.2

FOREIGN PATENT DOCUMENTS
2-40961  2/1990  Japan .
2-49475  2/1990  Japan .

*Primary Examiner*—Roy V. King
*Attorney, Agent, or Firm*—Fish & Richardson

[57] ABSTRACT

A method of depositing an amorphous silicon based film that has controlled resistivity in between that of an intrinsic amorphous silicon and an n$^+$ doped amorphous silicon on a substrate for an electronic device by a chemical vapor deposition process or a plasma-enhanced chemical vapor deposition process.

21 Claims, 2 Drawing Sheets

METHOD OF DEPOSITING AMORPHOUS SILICON BASED FILMS HAVING CONTROLLED CONDUCTIVITY

FIELD OF THE INVENTION

The present invention generally relates to a method of depositing on a substrate an amorphous silicon based film that has controlled electrical conductivity and more particularly, relates to a method of depositing an amorphous silicon based film that has controlled conductivity in between that of an intrinsic amorphous silicon and an $n^+$ doped amorphous silicon. The film may be deposited onto a substrate by a chemical vapor deposition process.

BACKGROUND OF THE INVENTION

In recent years, flat panel display devices have been developed for use in many electronic applications including notebook computers. One such device, an active matrix liquid crystal display, has been used frequently. However, the liquid crystal display device has inherent limitations that render it unsuitable for many applications. For instance, liquid crystal displays have fabrication limitations such as a slow deposition process of amorphous silicon on glass, high manufacturing complexity and low yield. The displays require a power-hungry fluorescent backlight while most of the light is wasted. A liquid crystal display image is also difficult to see in bright sunlight or at extreme viewing angles which present a major concern in many applications.

A more recently developed device of a field emission display (FED) overcomes some of these limitations and provides significant benefits over the liquid crystal display devices. For instance, the FEDs have higher contrast ratio, larger viewing angle, higher maximum brightness, lower power consumption and a wider operating temperature range when compared to a typical thin film transistor liquid crystal display device.

Unlike the liquid crystal displays, field emission displays (FEDs) produce their own light using colored phosphors. The FEDs do not require complicated, power-consuming backlights and filters and almost all the light generated by an FED is visible to the user. The FEDs do not require large arrays of thin-film transistors. A major source of yield problems for active matrix liquid crystal displays is therefore eliminated.

In a FED, electrons are emitted from a cathode and impinge on phosphors on the back of a transparent face plate to produce an image. It is known that such a cathodoluminescent process is one of the most efficient ways for generating light. Unlike a conventional CRT, each pixel in an FED has its own electron source, typically an array of emitting microtips. The voltage difference between the cathode and the gate extracts electrons from the cathode and accelerates them towards the phosphors. The emission current and thus the display brightness, is strongly dependent on the work function of the emitting material. The cleanliness and uniformity of the emitter source material are therefore essential.

Most FEDs are evacuated to low pressures, i.e., $10^{-7}$ torr, to provide a long mean free path for emitted electrons and to prevent contamination and deterioration of the tips. Display resolution is improved by using a focus grid to collimate the electrons drawn from the microtips.

The first field emission cathodes developed for a display device used a metal microtip emitter of molybdenum. In such a device, a silicon wafer is first oxidized to produce a thick $SiO_2$ layer and then a metallic gate layer is deposited on top of the oxide. The gate layer is then patterned to form gate holes. Etching the $SiO_2$ underneath the holes undercuts the gate and creates a well. A sacrificial layer such as Ni is deposited to prevent deposition of nickel into the emitter well. Molybdenum is then deposited at normal incidence such that a cone with a sharp point grows inside the cavity until the hole closes above it. An emitter cone is left when the sacrificial layer is removed.

In another FED device, silicon microtip emitters are produced by first thermal oxidation of silicon and followed by patterning of the oxide and selective etching to form silicon tips. Further oxidation or etching protects the silicon and sharpens the point to provide a sacrificial layer.

In an alternative design, the microtips are added onto a substrate of desired materials such as glass, which is an ideal substrate material for large area flat panel display. The microtips can be made of conducting materials such as metals or doped semiconductors. In such a FED device, an interlayer with controlled conductivity between the cathode and the microtips is highly desirable. Proper engineering of the resistivity of the interlayer enables the device to operate in a stable and controllable fashion. The resistivity of the interlayer is in the order between an insulator and a conductor, while the actual desired value depends on the specifics of the device design.

Chemical vapor deposition (CVD) or plasma-enhanced chemical vapor deposition (PECVD) are processes widely used in the manufacture of semiconductor devices for depositing layers of materials on various substrates. In a conventional PECVD process, a substrate is placed in a vacuum deposition chamber equipped with a pair of parallel plate electrodes. The substrate is generally mounted on a susceptor which is also the lower electrode. A reactant gas flows into the deposition chamber through a gas inlet manifold which also serves as the upper electrode. A radio frequency (RF) voltage is applied between the two electrodes which generates an RF power sufficient to cause a plasma to be formed in the reactant gas. The plasma causes the reactant gas to decompose and deposit a layer of the desired material on the surface of the substrate body. Additional layers of other electronic materials can be deposited on the first layer by flowing into the deposition chamber a reactant gas containing the material of the additional layer to be deposited. Each reactant gas is subjected to a plasma which results in the deposition of a layer of the desired material.

In the fabrication of a field emission display device, it is desirable to deposit an amorphous silicon based film that has electrical conductivity in an intermediate range between that of intrinsic amorphous silicon and $n^+$ doped amorphous silicon. The conductivity of the $n^+$ doped amorphous silicon is controlled by adjusting the amount of phosphorus atoms contained in the film. Even though it is possible, in principle, to produce an intermediate conductivity film by adding very small amounts of phosphorus atoms, it is a very difficult task, i.e. requires specially premixed $PH_3/H_2$ to precisely control the amounts of the phosphorus atoms.

Since field emitting display devices use very thick layers, it becomes necessary to deposit low stress films to prevent warping of the glass and peeling of the films. The standard process for depositing amorphous silicon produces films that are highly compressive, especially when deposited at high deposition rates.

It is therefore an object of the present invention to provide a method of depositing amorphous silicon based films that have controlled conductivity in a chemical vapor deposition process or a plasma-enhanced chemical vapor deposition process that does not have the shortcomings of the prior art methods.

It is another object of the present invention to provide a method of depositing amorphous silicon based films that have controlled conductivity and low stress in a chemical vapor deposition process or a plasma-enhanced chemical vapor deposition process by incorporating simple process control steps.

It is still another object of the present invention to provide a method of depositing amorphous silicon based films that have controlled conductivity and low stress in a chemical vapor deposition process or a plasma-enhanced chemical vapor deposition process by using a reactant gas mixture containing $PH_3$ and $NH_3$.

It is yet another object of the present invention to provide a method of depositing amorphous silicon based films that have controlled conductivity and low stress in a chemical vapor deposition process or a plasma enhanced chemical vapor deposition process by controlling the flow rates of the reactant gases in the reaction chamber.

SUMMARY OF THE INVENTION

The present invention provides a deposition method for preparing amorphous silicon based films with controlled resistivity and low stress. Such films can be used as the interlayer in the FED manufacturing. They can also be used in other electronic devices which require films with controlled resistivity in the range between those of an insulator and of a conductor. The deposition method described in the present invention employs the method of chemical vapor deposition or plasma-enhanced chemical vapor deposition.

In a preferred embodiment, amorphous silicon based films of precisely controlled electrical conductivity and low stress are produced by flowing a reactant gas mixture into a plasma-enhanced chemical vapor deposition chamber. The reactant gas mixture comprises silane, ammonia and phosphine carried by a hydrogen gas. Changing the phosphorus content by controlling the phosphine partial pressure, the n-type electrical conductivity of the amorphous silicon based film can be changed, i.e. increasing the phosphorus content increases the electrical conductivity. Changing the nitrogen content of the reactant gas by controlling the ammonia partial pressure, the resistivity can be changed, i.e. increasing the nitrogen content increases the resistivity of the amorphous silicon based film. An ideal range of resistivity for the field emission display devices is between about $10^3$ and about $10^7$ ohm-cm. The novel method described in this invention enables one to control the resistivity of an amorphous silicon based film within the desirable range of $10^3$ to $10^7$ ohm-cm. The films produced by the novel method have low tensile stress such that warping or peeling of films from substrates are avoided.

The present invention is also directed to a field emission display device fabricated by a plasma-enhanced chemical vapor deposition technique in which a reactant gas mixture comprising silane, hydrogen, phosphine (carried in hydrogen) and ammonia is used to produce an amorphous silicon based film having controlled electrical conductivity. By adjusting the flow rate of each component gas, an amorphous silicon based film having a precisely controlled electrical conductivity and low stress for forming a field emission device can be obtained.

BRIEF DESCRIPTION OF THE DRAWINGS

Other objects, features and advantages of the present invention will become apparent upon consideration of the specification and the appended drawings, in which.

DETAILED DESCRIPTION OF THE PREFERRED EMBODIMENT

The present invention discloses an improved method of depositing amorphous silicon based films having controlled electrical conductivity and low stress on a substrate for an electronic device, such as a field emission display device by a plasma enhanced chemical vapor deposition technique.

Figure 1:
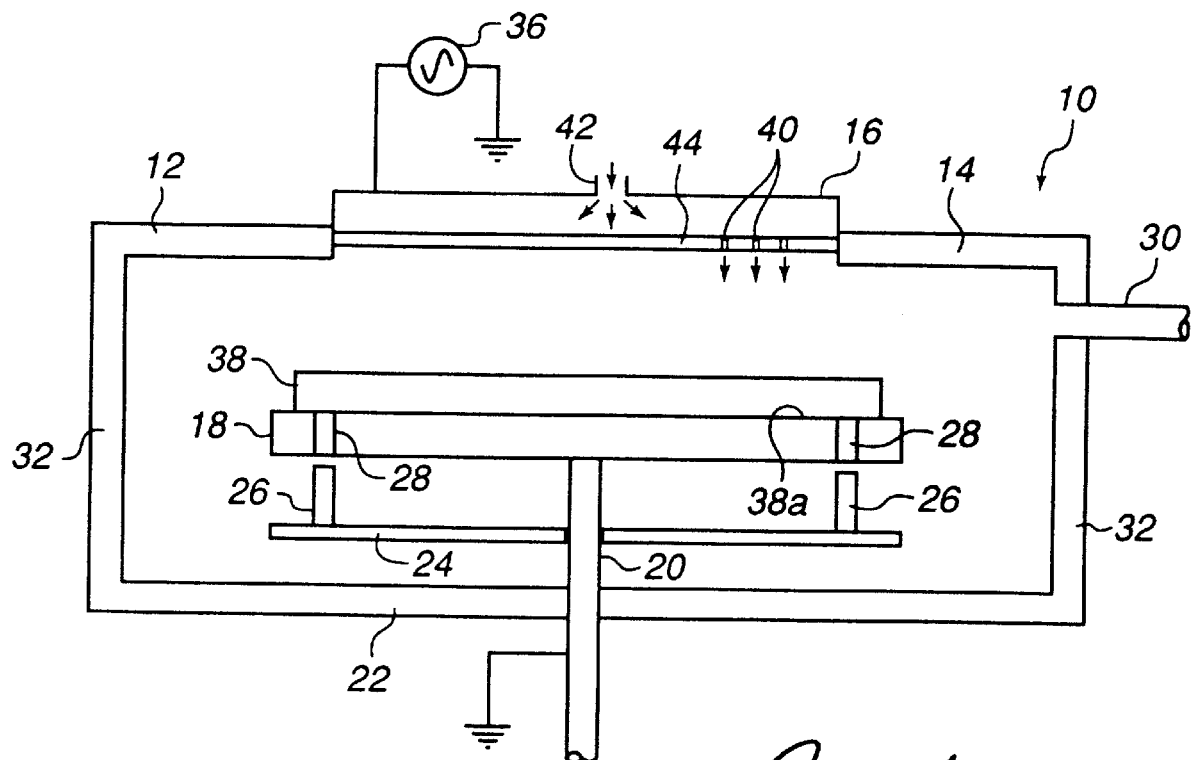
FIG. 1 is a schematic sectional view of a plasma-enhanced chemical vapor deposition chamber in which the method in accordance with the present invention can be carried out.

Referring initially to FIG. 1, there is shown a schematic sectional view of a plasma-enhanced chemical vapor deposition apparatus 10 in which the method in accordance with the present invention can be carried out. Turner et al. disclose such an apparatus in U.S. Pat. No. 5,512,320, issued Apr. 30, 1996. A deposition chamber 12 includes an opening through a top wall 14 and a first electrode or a gas inlet manifold 16 within the opening. Alternatively, the top wall 14 can be solid with the electrode 16 being adjacent to the inner surface thereof. Within chamber 12 is a susceptor 18 in the form of a plate which extends parallel to the first electrode 16. The susceptor 18 is typically of aluminum and is coated with a layer of aluminum oxide. The susceptor 18 is connected to ground so that it serves as a second electrode so as to connect the RF source 36 across the two electrodes 16 and 18.

The susceptor 18 is mounted on the end of a shaft 20 which extends vertically through a bottom wall 22 of the deposition chamber 12. The shaft 20 is movable vertically so as to permit the movement of the susceptor 18 vertically toward and away from the first electrode 16. A lift-off plate 24 extends horizontally between the susceptor 18 and the bottom wall 22 of the deposition chamber 12 substantially parallel to the susceptor 18 and is vertically movable. Lift-off pins 26 project vertically upwardly from the lift-off plate 24. The lift-off pins 26 are positioned to be able to extend through lift holes 28 in the susceptor 18, and are of a length slightly longer than the thickness of the susceptor 18. While there are only two lift-off pins 26 shown in the figure, there may be more lift-off pins 26 spaced around the lift-off plate 24.

A gas outlet 30 extends through a side wall 32 of the deposition chamber 12 and is connected to means (not shown) for evacuating the deposition chamber 12. A gas inlet pipe 42 extends into the first electrode or the gas inlet manifold 16 of the deposition chamber 12, and is connected through a gas switching network (not shown) to sources (not shown) of various gases. The first electrode 16 is connected to an RF power source 36. A transfer paddle (not shown) is typically provided to carry substrates through a load-lock door (not shown) into the deposition chamber 12 and onto the susceptor 18, and also to remove the coated substrate from the deposition chamber 12.

In the operation of the deposition apparatus 10, a substrate 38 is first loaded into the deposition chamber 12 and is placed on the susceptor 18 by the transfer paddle (not shown). The substrate 38 is of a size to extend over the lift holes 28 in the susceptor 18. A commonly used size for a flat panel display device substrate is approximately 360 mm by 465 mm. The susceptor 18 is positioned above the lift-off pins 26 by moving shaft 20 upwards such that the lift-off pins 26 do not extend through the holes 28, and the susceptor 18 and substrate 38 are relatively close to the first electrode 16. The electrode spacing or the distance between the substrate surface and the discharge surface of the gas inlet manifold 16 is between about 12 to about 50 mm. A more preferred electrode spacing is between about 20 to about 36 mm.

Before the deposition process of the invention, the substrate 38, which may be a large sheet of a transparent material, is processed according to well known techniques. After the initial processing in the preferred embodiment, a top most layer containing a patterned metal is deposited.

At the start of the deposition process of the invention, the deposition chamber 12 is first evacuated through the gas outlet 30. The patterned substrate 38 is then positioned on the susceptor 18. The substrate 38 is kept at a temperature between about 200° C. and about 400° C. during deposition of the present invention amorphous silicon film. A preferred temperature range for the substrate is between about 300° C. and about 350° C. during deposition. A pressure is maintained in the reaction chamber during deposition at between about 0.5 torr and about 5 torr, a preferred pressure range is between about 1.5 torr and about 2.5 torr. A detailed description of processing with this apparatus is contained in U.S. Pat. No. 5,399,387 to Law et al. assigned to the common assignee which is hereby incorporated by reference in its entirety.

Figure 2:
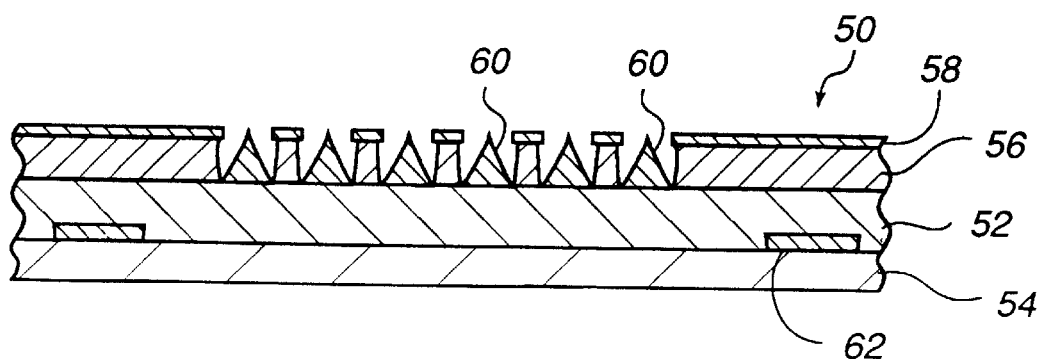
FIG. 2 is an enlarged cross-sectional view of a typical field emission display device.

FIG. 2 shows an enlarged cross-sectional view of a typical field emission display device 50. The device 50 is formed by depositing a resistive layer 52 of amorphous silicon based film on a glass substrate 54. An insulator layer 56 and a metallic gate layer 58 are then formed together in such a way as to form metallic microtips 60. A cathode structure 60 is covered by the resistive layer 52. Thus, a resistive but somewhat conductive amorphous silicon layer 52 underlies a highly insulating layer 56, such as of $SiO_2$. It is important to be able to control the resistivity of the amorphous silicon layer 52 so that it is not overly resistive but it will act as a limiting resistor to prevent excessive current flow if one of the microtips 60 shorts to the metal layer 58.

It should be noted that while a field emission display device is shown here to demonstrate the present invention method, the method is by no means limited to the fabrication of FEDs. The present invention method can be used in the fabrication of any electronic devices that require a deposition of a layer having controlled resistivity.

A series of tests were conducted on test samples prepared by the present invention method to determine the effects of the reactant flow rates upon the conductivity and the stress of the films produced. Their results are summarized in Tables 1 and 2.

EXAMPLE 1

Example 1 illustrates a deposition process for an intrinsic amorphous silicon film that does not contain doping gases in the reactant gas mixture. The flow rate of silane is controlled at 1,000 sccm, the flow rate of hydrogen is controlled at 1,000 sccm, the plasma power (i.e. RF power) used is 300 W, the pressure of the chamber is kept at 2.0 torr, the electrode spacing is kept at 962 mils, the susceptor temperature is kept at 410° C., and the deposition rate obtained is 168 nm/min. After the completion of the deposition process, the films obtained were tested to produce the following physical properties, a compressive stress of $8.0 \times 10^8$ dyne/$cm^2$ and a resistivity of $2.0 \times 10^9$ ohm-cm.

EXAMPLE 2

Example 2 illustrates a deposition process for p-doped amorphous silicon wherein the film was deposited with a flow of $PH_3$ gas but with no $NH_3$ gas. The flow rate of silane is 1,000 sccm, the flow rate of $PH_3$ is 0.5 sccm, the flow rate of hydrogen is 1,000 sccm, the RF power used is 300 W, the pressure of the chamber is 2.0 torr, the susceptor spacing is 962 mils, the susceptor temperature is 410° C., and the deposition rate achieved is 156 nm/min. The phosphine is a 0.5% concentration in a hydrogen carrier that is otherwise accounted for in the cited flow rates. The amorphous silicon film obtained has a compressive stress of $1.7 \times 10^9$ dyne/$cm^2$ and a resistivity of $1.7 \times 10^2$ ohm-cm.

EXAMPLE 3

In this example, only ammonia gas and not $PH_3$ gas is used in the reactant gas mixture. The flow rate of silane gas used is 1,000 sccm, the flow rate of $NH_3$ is 500 sccm, the flow rate of hydrogen gas is 1,000 sccm, the RF power used is 300 W, the pressure of the chamber is kept at 2.0 torr, the electrode spacing is 962 mils, the temperature of the susceptor is 410° C., and a deposition rate of 135 nm/min was obtained. The physical properties obtained for the film are quite different than that obtained in Example 2. The stress of the film is in a tensile mode of $7.4 \times 10^9$ dyne/$cm^2$. The resistivity of the film measured has a high value of $2.2 \times 10^{10}$ ohm-cm.

EXAMPLE 4

In this example, a doping gas of $PH_3$ and a nitrogen-containing gas of $NH_3$ are used in the reactant gas mixture. The flow rate ratio of $PH_3$ to $NH_3$ is $1.25 \times 10^{-2}$. The flow rate of silane is 1,000 sccm, the flow rate of $PH_3$ is 2.5 sccm, the flow rate of $NH_3$ is 200 sccm, the flow rate of $H_2$ is 1,000 sccm. The RF power used is 600 W, the pressure of the chamber is 2.0 torr, the spacing of the electrodes is 962 mils, the susceptor temperature is 400° C., and the deposition rate obtained is 197 nm/min. An amorphous silicon film having a desirable resistivity is obtained. The physical properties of the film are measured at a tensile stress of $4.0 \times 10^8$ dyne/$cm^2$ and a resistivity of $1.6 \times 10^5$ ohm-cm. It is noted that the resistivity value is about halfway between the two extreme values shown in Example 2 and Example 3, i.e. $1.7 \times 10^2$ and $2.2 \times 10^{10}$.

EXAMPLE 5

In this example, both gases of $PH_3$ and $NH_3$ are used in the reactant gas mixture. The flow rate ratio of the two gases $PH_3$ and $NH_3$ is $0.75 \times 10^{-2}$. In this chemical vapor deposition process, the flow rate of silane is 1,000 sccm, the flow rate of $NH_3$ is 200 sccm, the flow rate of $PH_3$ is 1.5 sccm, the flow rate of $H_2$ is 1,000 sccm, the RF power used is 600 W, the pressure of the chamber is kept at 2.0 torr, the spacing between the electrodes is 962 mils, the temperature of the susceptor is kept at 400° C., and a deposition rate of 197 nm/min is obtained. The physical properties of the films obtained are a tensile stress at $1.3 \times 10^9$ dyne/$cm^2$ and a resistivity at $9.6 \times 10^5$ ohm-cm. It is seen that by decreasing the flow rate of $PH_3$, the resistivity of the film when compared to Example 4 is increased and the tensile stress is only slightly increased.

EXAMPLE 6

In this example, both gases of $NH_3$ and $PH_3$ are used in the reactant gas mixture. The flow rate ratio of $PH_3$ and $NH_3$ is $1.5 \times 10^{-2}$. In the chemical vapor deposition process, a flow rate of silane at 1,000 sccm is used, a flow rate of $PH_3$ at 1.5 sccm is used, a flow rate of $NH_3$ at 100 sccm is used, a flow rate of $H_2$ at 1,000 sccm is used, an RF power of 600 W is used, a chamber pressure of 2.0 torr is used, a spacing between the electrodes of 962 mils is used, a susceptor temperature of 400° C. is used, and a deposition rate of 240 nm/min is obtained. Amorphous silicon films having properties of a tensile stress at $4.7 \times 10^9$ dyne/cm$^2$ and a resistivity at $3.6 \times 10^5$ ohm-cm are obtained. It is seen in comparison to Example 5 that by decreasing the ammonia content in the reactant gas mixture, the resistivity of the deposited film is reduced and the tensile stress is slightly increased.

EXAMPLE 7

In this example, both gases of $PH_3$ and $NH_3$ are used in the reactant gas mixture. The flow rate ratio of the two gases $PH_3$ and $NH_3$ is $0.6 \times 10^{-2}$. It is believed that a flow rate ratio of $PH_3$:$NH_3$ as low as $0.1 \times 10^{-2}$ or 0.001:1 may be used. In the chemical vapor deposition process, the flow rate of silane is 1,000 sccm, the flow rate of $NH_3$ is 200 sccm, the flow rate of $PH_3$ is 1.5 sccm, the flow rate of $H_2$ is 1,000 sccm, the RF power used is reduced to 400 W, the pressure of the chamber is kept at 2.0 torr, the spacing between the electrodes is 962 mils, the temperature of the susceptor is kept at 400° C., and a deposition rate of 180 nm/min is obtained. The physical properties of the films obtained are a tensile stress at $6.3 \times 10^9$ dyne/cm$^2$ and a resistivity at $7.0 \times 10^6$ ohm-cm. It is seen that by increasing the flow rate of $NH_3$ and comparing to Example 6, the resistivity of the film is greatly increased while the tensile stress almost remained constant.

EXAMPLE 8

In this example, both gases of $PH_3$ and $NH_3$ are used in the reactant gas mixture. The flow rate ratio between the two gases $PH_3$ and $NH_3$ is $2.5 \times 10^{-2}$. It is believed that a flow rate ratio of $PH_3$:$NH_3$ as high as $1 \times 10^{-1}$ or 0.1:1 may be used. In the chemical vapor deposition process, the flow rate of silane is 1,000 sccm, the flow rate of $NH_3$ is 100 sccm, the flow rate of $PH_3$ is 2.5 sccm, the flow rate of $H_2$ is 1,000 sccm, the RF power used is 400 W, the pressure of the chamber is kept at 2.0 torr, the spacing between the electrodes is 962 mils, the temperature of the susceptor is kept at 400° C., and a deposition rate of 190 nm/min is obtained. The physical properties of the films obtained are a tensile stress at $4.8 \times 10^9$ dyne/cm$^2$ and a resistivity at $6.0 \times 10^4$ ohm-cm. It is seen that by increasing the flow rate of $PH_3$ and comparing to Example 7, the resistivity of the film is greatly decreased while the tensile stress remains essentially constant.

EXAMPLE 9

In Example 9, a doping gas of $PH_3$ and a gaseous nitrogen $N_2$ are used in a reactant gas mixture. The flow rate of silane is 1,000 sccm, the flow rate of $PH_3$ is 2.5 sccm, the flow rate of $N_2$ is 1,500 sccm, and the flow rate of $H_2$ is 1,000 sccm. The RF power used is 600 W, the pressure of the chamber is 1.2 torr, the spacing of the electrodes is 962 mils, the susceptor temperature is 400° C., and the deposition rate obtained is 190 nm/min. An amorphous silicon film having a desirable resistivity is obtained. The physical properties of the film are measured at a tensile stress of $2.5 \times 10^9$ dyne/cm$^2$ and a resistivity of $9.6 \times 10^5$ ohm-cm. As expected, increasing the concentration of nitrogen increases the resistivity and decreases the conductivity.

EXAMPLE 10

In Example 10, a doping gas of $PH_3$ and gaseous nitrogen $N_2$ are used in the reactant gas mixture. The flow rate of silane is 1,000 sccm, the flow rate of $PH_3$ is 2.5 sccm, the flow rate of $N_2$ is 500 sccm, and the flow rate of $H_2$ is 1,500 sccm. The RF power used is 600 W, the pressure of the chamber is 1.2 torr, the spacing of the electrodes is 962 mils, the susceptor temperature is 400° C., and the deposition rate obtained is 914 nm/min. An amorphous silicon film having a desirable resistivity is obtained. The physical properties of the film are measured at a compressive stress of $1.1 \times 10^9$ dyne/cm$^2$ and a resistivity of $8.2 \times 10^2$ ohm-cm. The data is consistent with the results obtained on the other examples.

Examples 1 through 3 shown above are comparative examples prepared by prior art methods. Examples 4 through 10 shown above illustrate the advantages made possible by the present invention. The data for Examples 1 through 10 are shown below in Tables 1 and 2.

TABLE 1

| | Example 1 | Example 2 | Example 3 | Example 4 | Example 5 |
| --- | --- | --- | --- | --- | --- |
| SiH$_4$ sccm | 1000 | 1000 | 1000 | 1000 | 1000 |
| PH$_3$ sccm | — | 0.5 | — | 2.5 | 1.5 |
| NH$_3$ sccm | — | — | 500 | 200 | 200 |
| PH$_3$/NH$_3$ × 10$^2$ | — | — | — | 1.25 | 0.75 |
| H$_2$ sccm | 1000 | 1000 | 1000 | 1000 | 1000 |
| power W | 300 | 300 | 300 | 600 | 600 |
| pressure torr | 2.0 | 2.0 | 2.0 | 2.0 | 2.0 |
| spacing mil | 962 | 962 | 962 | 962 | 962 |
| temp ° C. | 410 | 410 | 410 | 400 | 400 |
| dep rate nm/min | 168 | 156 | 135 | 197 | 197 |
| stress dyne/cm$^2$ | C8.0E8 | C1.7E9 | T7.4E9 | T4.0E8 | T1.3E9 |
| resistivity ohm – cm | 2.0E9 | 1.7E2 | 2.2E10 | 1.6E5 | 9.6E5 |

TABLE 2

| | Example 6 | Example 7 | Example 8 | Example 9 | Example 10 |
| --- | --- | --- | --- | --- | --- |
| SiH$_4$ sccm | 1000 | 1000 | 1000 | 1000 | 1000 |
| PH$_3$ sccm | 1.5 | 1.5 | 2.5 | 2.5 | 2.5 |
| NH$_3$ sccm | 100 | 250 | 100 | — | — |
| PH$_3$/NH$_3$ × 10$^2$ | 1.50 | 0.60 | 2.50 | — | — |
| N$_2$ sccm | — | — | — | 1500 | 500 |
| H$_2$ sccm | 1000 | 1000 | 1000 | 1000 | 1500 |
| power W | 600 | 400 | 400 | 600 | 600 |
| pressure torr | 2.0 | 2.0 | 2.0 | 1.2 | 1.2 |
| spacing mil | 962 | 962 | 962 | 962 | 962 |
| temp ° C. | 400 | 400 | 400 | 400 | 400 |
| dep rate nm/min | 240 | 180 | 190 | 190 | 194 |
| stress dyne/cm$^2$ | T4.7E9 | T6.3E9 | T4.8E9 | T2.5E9 | C1.1E9 |
| resistivity ohm – cm | 3.6E5 | 7.0E6 | 6.0E4 | 9.0E5 | 8.2E2 |

Figure 3:
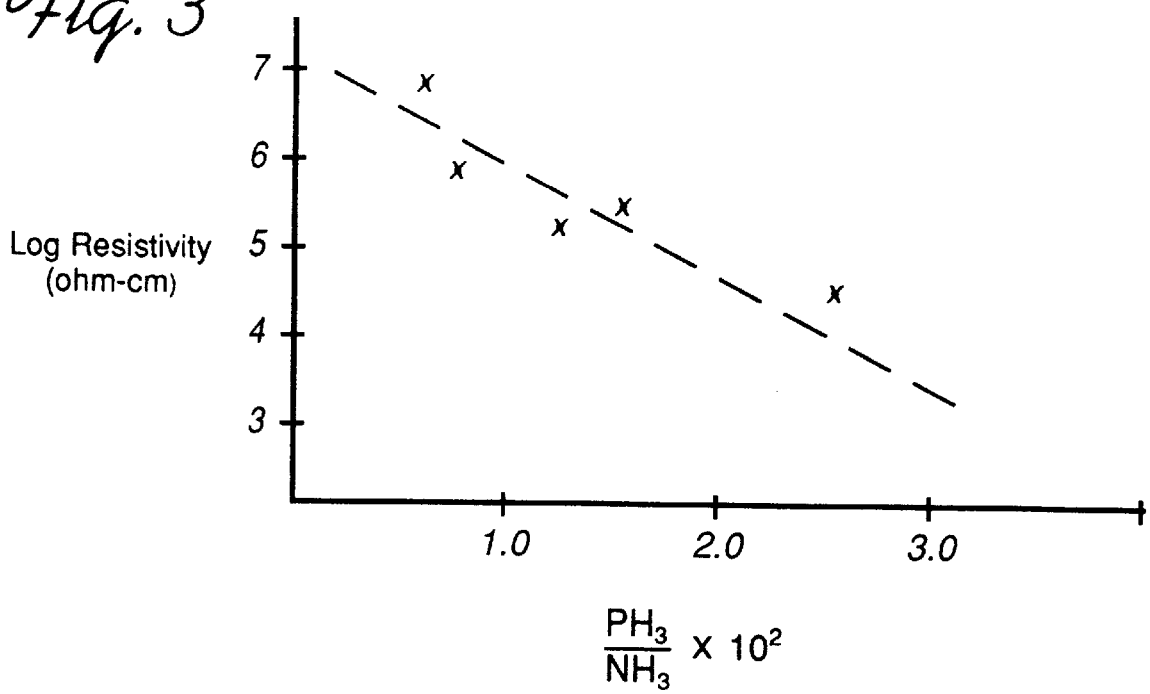
FIG. 3 is a graph illustrating the dependence of resistivity on the flow rate ratio between $PH_3$ and $NH_3$.

By mixing the doping gases of $PH_3$ and $NH_3$ together at various volume ratios, i.e. in the range between about 1:1000 and about 1:10 for $PH_3$:$NH_3$, amorphous silicon films having desirable stress values and resistivity values can be obtained. It is shown in FIG. 3 that by changing the phosphine content in the reactant gas mixture, the conductivity of the films can be changed. For instance, increasing the phosphine content increases the conductivity of the film since phosphorus is an electron doner. Similarly, changing the nitrogen content in the reactant gas mixture changes the resistivity of the film obtained since nitrogen contributes to the insulating property of the film. For instance, by increasing the nitrogen content of the reactant gas mixture, the resistivity of the amorphous silicon film obtained is increased. A desirable range for the resistivity of the present invention amorphous silicon based film is between about $10^3$ and about $10^7$ ohm-cm. This is supported by the data shown in Table 1 and other experimental data not presented here. A preferred range of resistivity is between about $10^5$ and about $10^6$ ohm-cm.

Figure 4:
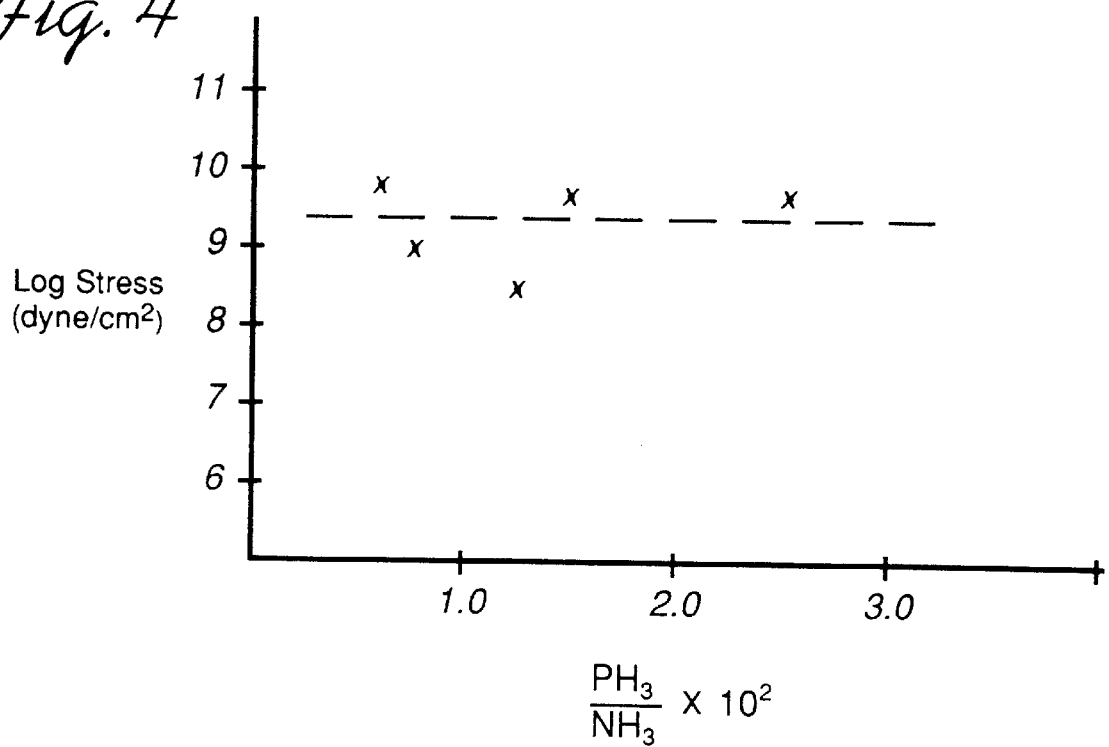
FIG. 4 is a graph illustrating the dependence of stress on the flow rate ratio between $PH_3$ and $NH_3$.

The stress level in the films is generally preferred to be minimized. The stress values should be kept in the low $10^9$ dyne/cm$^2$ or in the high $10^8$ dyne/cm$^2$ range. As seen in FIG. 4, the stress level remains essentially constant with changing flow rate ratios of $PH_3$:$NH_3$. The present invention novel method enables a suitable control of the type of stress in the amorphous silicon film deposited.

Examples 1 through 8 used ammonia as the nitrogen-containing gas. Examples 9 and 10 used gaseous nitrogen $N_2$ as the nitrogen-containing gas and produced controllable resistivities in the range of $10^2$ to $10^4$ ohm-cm. It is believed that yet other nitrogen-containing gas such as $N_2O$ would produce similar results.

We believe that the nitrogen is introduced into the amorphous silicon matrix at levels far above those associated with doping levels. While increasing concentrations of the semiconductor n-type dopant P from the $PH_3$ increases conductivities (decreases resistivities), increasing concentrations of nitrogen tend to increase the electronic bandgap as the resultant material progressively changes from amorphous silicon to silicon nitride. The larger bandgaps are associated with increased resistivity. Thus, similar effects should be obtainable by use of carbon-containing or oxygen-containing gases which drive the material toward the semi-insulator silicon carbide and the dielectric silicon dioxide.

The examples thus show an amorphous silicon film having a resistivity controllable in the range of $10^2$ to $10^7$ ohm-cm. We believe that the controllable range can be extended to $10^{10}$ ohm-cm by using very limited amounts of phosphine, particularly with the heavy ammonia concentration of Example 3. The invention thus provides a method of controllably achieving resistivities in the range of $10^3$ to $10^9$ ohm-cm, which were not easily obtainable in the prior art.

While the present invention has been described in an illustrative manner, it should be understood that the terminology used is intended to be in a nature of words of description rather than of limitation.

Furthermore, while the present invention has been described in terms of a preferred embodiment thereof, it is to be appreciated that those skilled in the art will readily apply these teachings to other possible variations of the invention. For instance, other volume ratios between the doping gases may be suitably used in place of those shown in the examples. The dopant gas $PH_3$ of the examples provides n-type doping. Other n-type dopant gases may be used with the invention. Also, p-type dopant gases, such as $B_2H_6$, may be used with the invention. The hydrogen gas of the examples is less reducing than $NH_3$ and thus acts primarily as a carrier gas although it is conventional to use hydrogen to deposit high-quality amorphous silicon. Other carrier gases that are less reducing than the nitrogen-containing gas can be substituted for the $H_2$. Examples of such carrier gases are Ar and He. Furthermore, even though the process of PECVD is used to deposit layers in a field emission display device, other processes such as CVD may also be used to deposit amorphous silicon based films that have controlled conductivity in other semiconductor devices.

The embodiments of the invention in which an exclusive property or privilege is claimed are defined as follows:

1. A method of depositing an amorphous silicon based film having a predetermined resistivity in a chemical vapor deposition chamber comprising:
   providing a substrate;
   flowing a mixture of reactant gases comprising silane, hydrogen, phosphine and a nitrogen-containing gas into said chamber; and
   adjusting the flow rate of at least one of said phosphine and nitrogen-containing gases into said chamber to obtain said predetermined resistivity.

2. A method according to claim 1, wherein said film is a component of a flat panel display device.

3. A method according to claim 1, wherein said film is a component of a field emission display device.

4. A method according to claim 1 further comprising the step of igniting a plasma in said mixture of reactant gases.

5. A method according to claim 1, wherein said nitrogen-containing gas is ammonia.

6. A method according to claim 5, wherein said phosphine and said ammonia are flown into said chamber at a flow rate ratio of phosphine:ammonia between about 1:1000 and about 1:10.

7. A method according to claim 1, wherein said nitrogen-containing gas is nitrous oxide.

8. A method according to claim 1 further comprising forming a second amorphous silicon film on and having a resistivity higher than said deposited film.

9. A method as recited in claim 5 wherein said phosphine and said ammonia are flowed into said chamber at a flow rate ratio of phosphine:ammonia of between about 0.001 and 0.1.

10. A method as recited in claim 9, wherein said flow rate ratio is between 0.006 and 0.025.

11. A method as recited in claim 1, wherein said nitrogen-containing gas comprises gaseous nitrogen and said phosphine and said gaseous nitrogen is flowed into said chamber at a flow rate ratio of phosphine:gaseous nitrogen of between about 0.0016 and 0.005.

12. A method of depositing an amorphous silicon based film having a predetermined electrical conductivity on a substrate in a chemical vapor deposition chamber comprising:
   providing a substrate for an electronic device,
   flowing a mixture of reactant gases comprising silane, hydrogen, phosphine and ammonia into said chamber, and
   igniting a plasma in said mixture of reactant gases.

13. A method according to claim 12, wherein said substrate is for a field emission display device.

14. A method according to claim 12, wherein said substrate is maintained at a temperature of between about 200° C. and about 400° C. during deposition.

15. A method according to claim 12, wherein said substrate is maintained at a temperature of between about 300° C. and about 350° C. during deposition.

16. A method according to claim 12, wherein a pressure is maintained in said chamber during deposition between about 0.5 torr and about 5 torr.

17. A method according to claim 12, wherein a pressure is maintained in said chamber during deposition of between about 1.5 torr and about 2.5 torr.

18. A method according to claim 12, wherein said deposited film has a tensile stress of not higher than about $5 \times 10^{10}$ dyne/cm$^2$.

19. A method according to claim 12, wherein said deposited film has a tensile stress between about $10^8$ and about $10^{10}$ dyne/cm$^2$.

20. A method according to claim 12, wherein said phosphine and ammonia are flowed into said chamber at a flow rate ratio of phosphine:ammonia between about 1:1000 and about 1:10.

21. A method of depositing an amorphous silicon file of predetermined resistivity on a substrate by a process of plasma-enhanced chemical vapor deposition in a plasma reaction chamber, comprising flowing a gas mixture into said chamber including silane, a dopant gas providing n-type doping, a first gas including a nitrogen-containing gas, and a carrier gas including hydrogen, wherein said dopant gas comprises $PH_3$.

* * * * *